United States Patent
Hsiao et al.

(10) Patent No.: US 7,420,432 B2
(45) Date of Patent: Sep. 2, 2008

(54) NOISE REMOVAL CIRCUIT

(75) Inventors: Chuan-Cheng Hsiao, Hsin-Chu (TW); Chuan Liu, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 90 days.

(21) Appl. No.: 11/456,583

(22) Filed: Jul. 11, 2006

(65) Prior Publication Data

US 2008/0024238 A1   Jan. 31, 2008

(51) Int. Cl.
*H03B 5/32* (2006.01)
*H03B 5/36* (2006.01)

(52) U.S. Cl. ........................ 331/173; 331/158

(58) Field of Classification Search ............. 331/49, 331/74, 75, 116 R, 116 FE, 158, 173
See application file for complete search history.

(56) References Cited

U.S. PATENT DOCUMENTS

| | | | |
|---|---|---|---|
| 3,984,703 A | 10/1976 | Jorgensen | |
| 5,869,978 A | 2/1999 | Hong | |
| 6,480,071 B1 * | 11/2002 | Fujii et al. | 331/74 |

* cited by examiner

*Primary Examiner*—David Mis
(74) *Attorney, Agent, or Firm*—Thomas, Kayden, Horstemeyer & Risley

(57) ABSTRACT

A noise removal circuit. The noise removal circuit comprises a crystal oscillator and a level decision module. The crystal oscillator generates an oscillating signal and an output clock signal. The level decision module detects the signal level of the oscillating signal and outputs the output clock signal when the signal level of the oscillating signal exceeds a first reference level.

31 Claims, 16 Drawing Sheets

US 7,420,432 B2

NOISE REMOVAL CIRCUIT

BACKGROUND OF THE INVENTION

1. Field of the Invention

The invention relates to a noise removal circuit, and more specifically to a circuit for removing noise from a signal generated by an oscillator.

2. Description of the Related Art

A crystal oscillator generates a signal for generating a clock. The Signal is input to a clock generator generating a clock signal necessary to drive a microprocessor. However, the oscillating signal generated by a crystal oscillator may include noise components due to printed circuit board noise, electromagnetic interference (EMI) and a switching noise of other devices. FIG. 1 is a schematic diagram of a crystal oscillator 110 comprising a resistor $R_f$, capacitors C1 and C2, inverters INV1 and INV2 and a vibrator 111 including a quartz 112, and quartz input plates 113. The capacitors C1 and C2 are coupled between both terminals of vibrator 111 and ground. A supply voltage $V_{DD}$ is applied to both the inverters INV1 and INV2. The inverter INV1 is coupled to the vibrator 111 and resistor $R_f$ respectively in parallel and generates an oscillating signal xtalmo. The inverter INV2 functions as a buffer and an amplifier to amplify the oscillating signal xtalmo received from the inverter INV1 and convert it to a square wave signal accordingly, generating an output clock signal X1. FIG. 2 shows a waveform of the oscillating signal xtalmo and the output clock signal X1 respectively. As shown, in the initial stage of the oscillation, the oscillating signal xtalmo includes noise components which may thereby affect the output of the inverter INV2, incurring generation of the output clock signal X1 of undesirable frequency. Thus, it is desirable to remove the noise generated in the oscillating initial state, avoiding potential effects on, for example, the microprocessors the output clock signal applied to.

BRIEF SUMMARY OF THE INVENTION

A detailed description is given in the following embodiments with reference to the accompanying drawings.

The invention is generally directed to a noise removal circuit. An exemplary embodiment of a noise removal circuit comprises a crystal oscillator and a level decision module. The crystal oscillator generates an oscillating signal and an output clock signal. The level decision module, coupled to the crystal oscillator, detects the signal level of the oscillating signal and outputs the output clock signal when the signal level of the oscillating signal exceeds a first reference level.

Another noise removal circuit is provided. The noise removal circuit comprises a crystal oscillator, a signal level detector, and a gating logic. The crystal oscillator generates an oscillating signal and an output clock signal. The signal level detector is coupled to the crystal oscillator and detects the signal level of the oscillating signal. The signal level detector then compares the detection result with a first reference level and generates an enable signal accordingly. The gating logic is coupled to the signal level detector and outputs the output clock signal in response to the enable signal.

Further, another noise removal circuit is provided. The noise removal circuit comprises a crystal oscillator and a timing circuit. The crystal oscillator generates an oscillating signal and an output clock signal. The timing circuit, coupled to the crystal oscillator, receives the oscillating signal and outputs the output clock signal after a predetermined interval.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
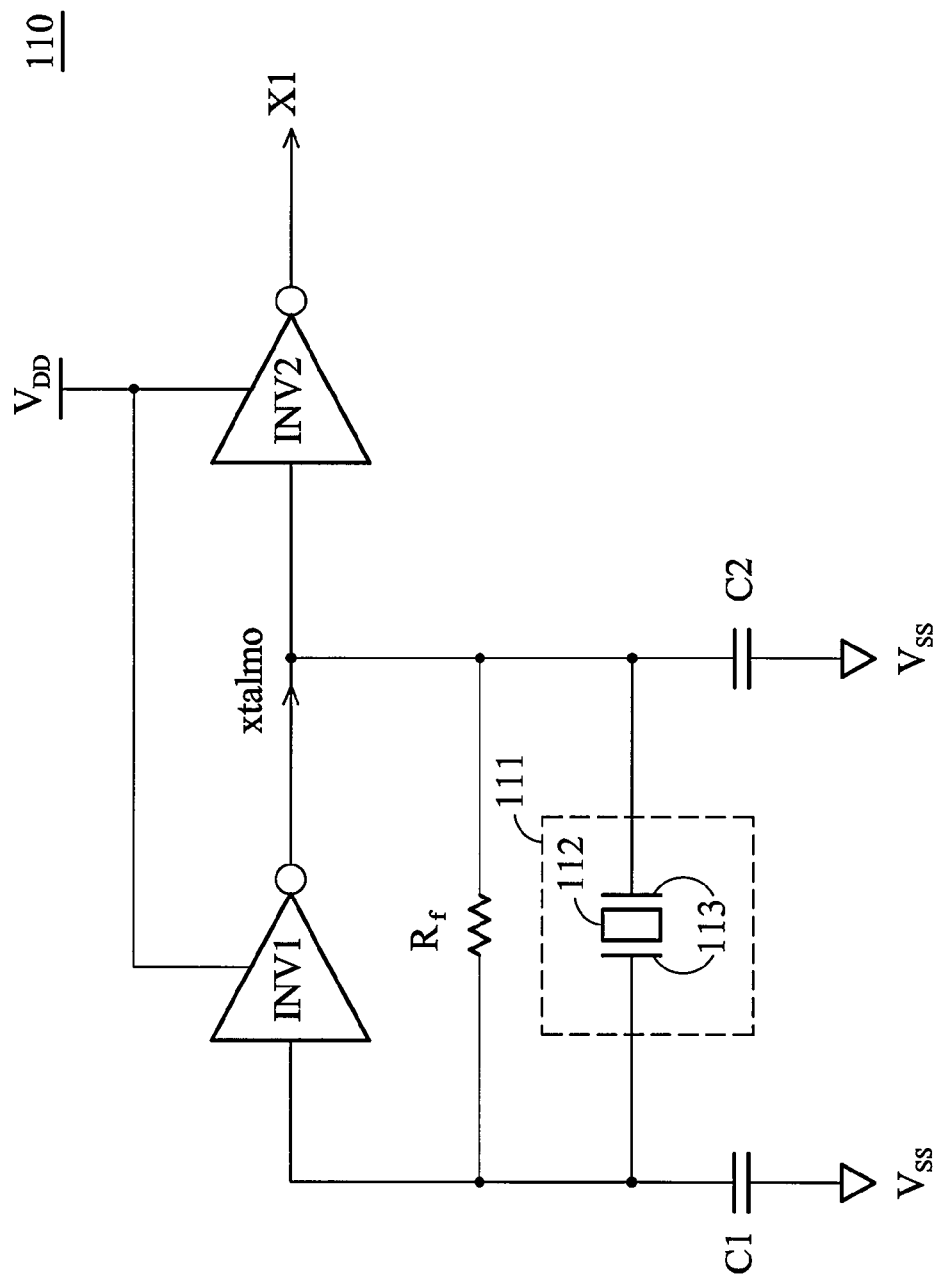
FIG. 1 is a schematic diagram of a conventional crystal oscillator.
Figure 2:
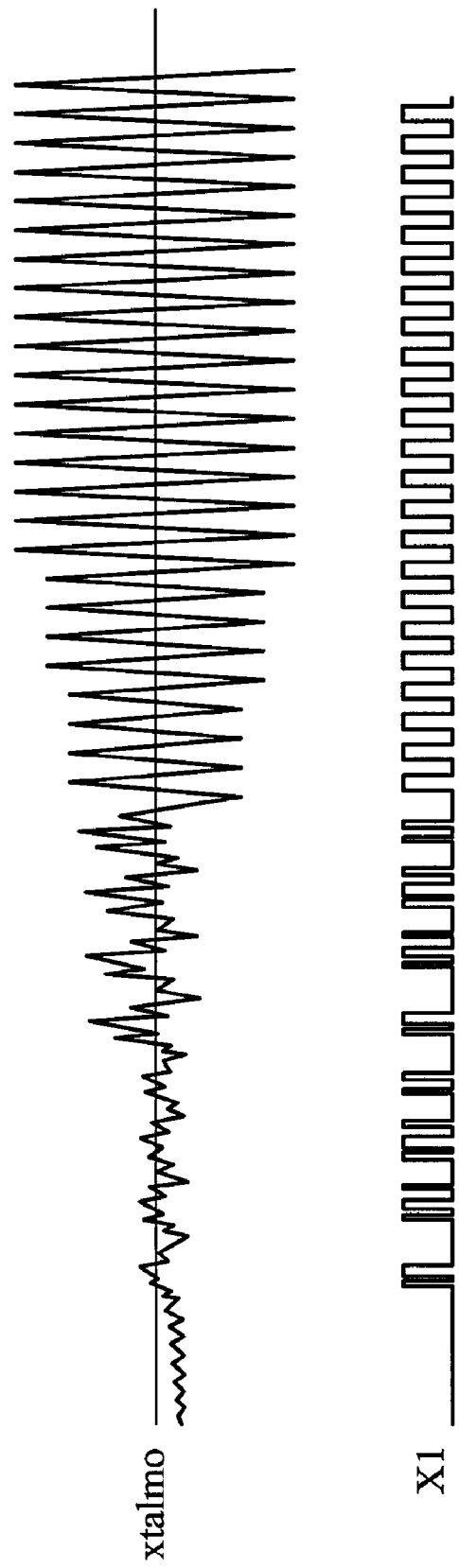
FIG. 2 shows waveforms of signals generated by the crystal oscillator of FIG. 1.
Figure 3:
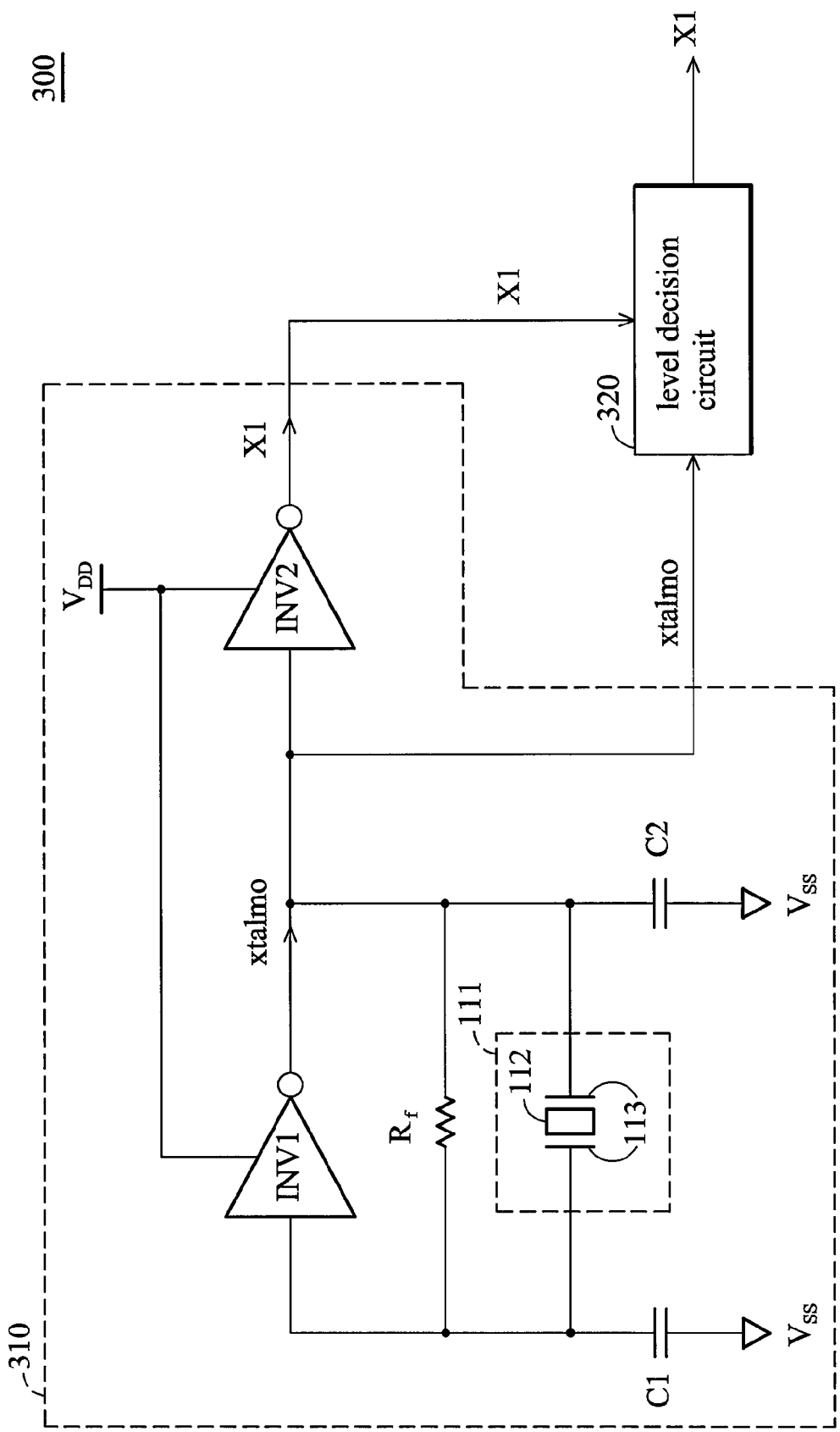
FIG. 3 is a schematic diagram of a noise removal circuit according to an embodiment of the invention.

FIG. 3 is a schematic diagram of a noise removal circuit 300 according to an embodiment of the invention, comprising a crystal oscillator 310 and a level decision module 320. FIG. 3 uses the same labels as FIG. 1 which perform the same function, and thus are not described in further detail. The crystal oscillator 310, similar to the crystal oscillator 110 generates an oscillating signal xtalmo and an output clock signal X1. The level decision module 320 coupled to the crystal oscillator 310, detects the signal level of the oscillating signal xtalmo and outputs the output clock signal X1 when the signal level of the oscillating signal xtalmo exceeds a reference level Vr.

Figure 4:
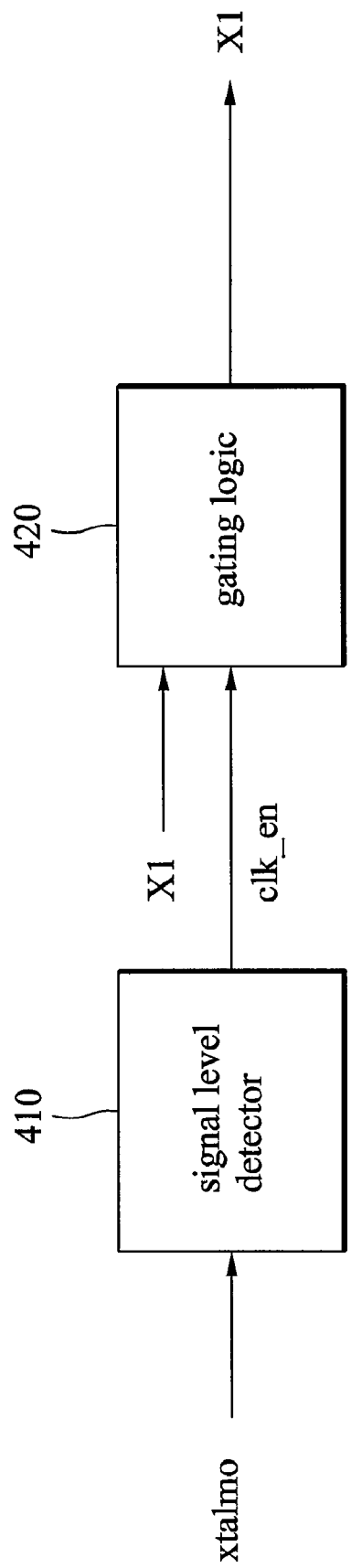
FIG. 4 shows an exemplary embodiment of a level decision module.

FIG. 4 shows an exemplary embodiment of the level decision module 320. As shown, the level decision module 320 comprises a signal level detector 410 and a gating logic 420. The signal level detector 410 receives the oscillating signal xtalmo from the crystal oscillator 310 to detect the signal level of the oscillating signal xtalmo and generate an enable signal clk_en accordingly. The gating logic 420, coupled to the signal level detector, receives the output clock signal X1 and the enable signal clk_en from the crystal oscillator 310 and the signal level detector 410 respectively and performs a combinational logic operation to output the output clock signal X1 in response to the enable signal clk_en.

Figure 5:
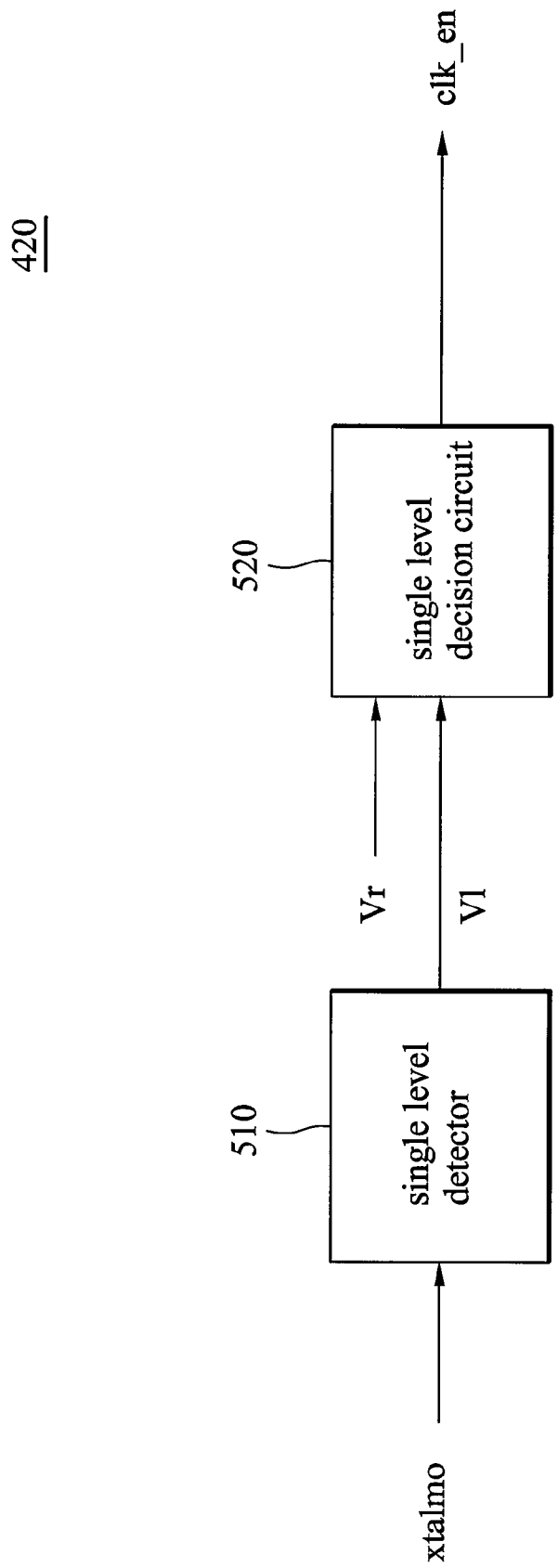
FIG. 5 shows an exemplary embodiment of a signal level detector.
Figure 6A:
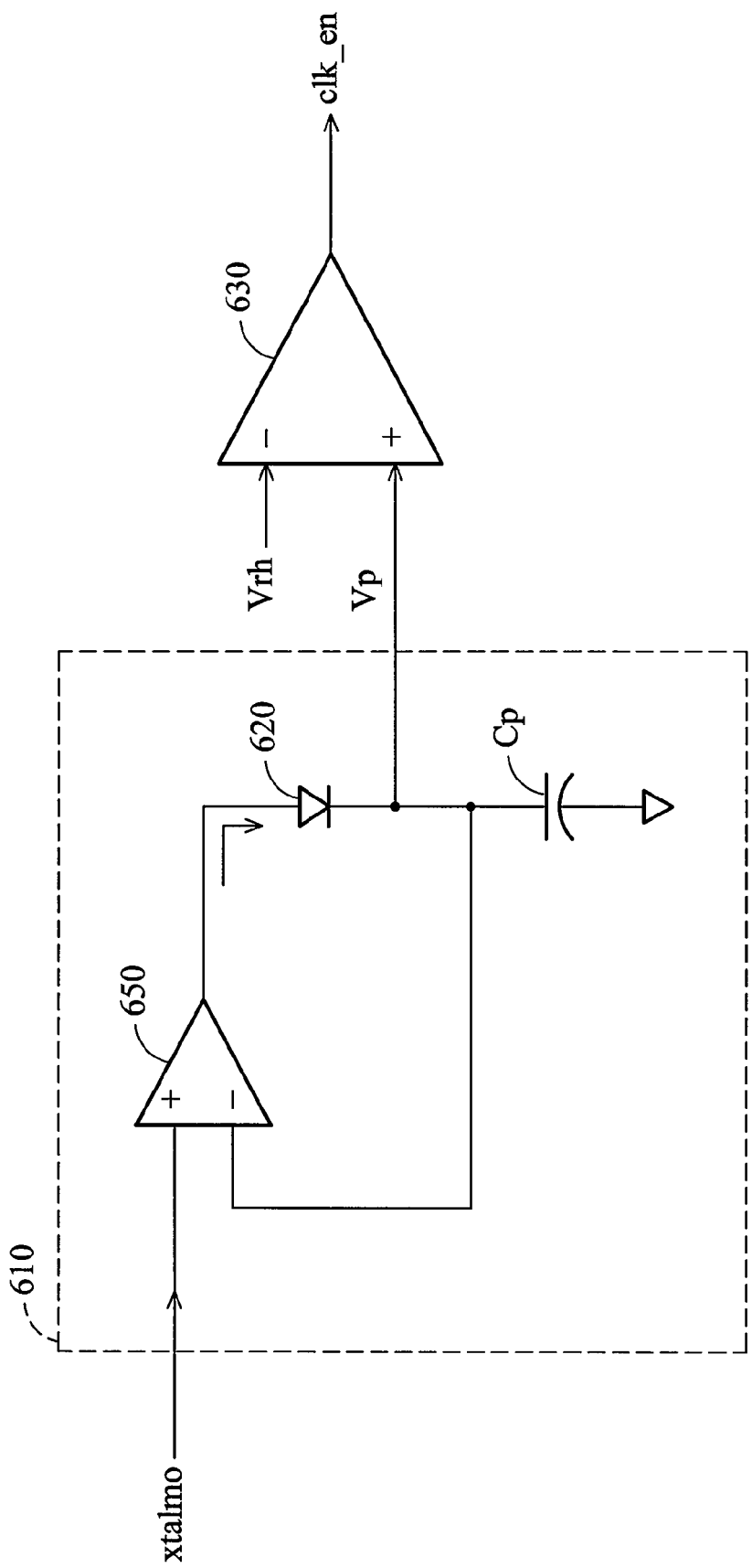
FIG. 6A shows an exemplary embodiment of a signal level detector utilizing a peak hold circuit.
Figure 6B:
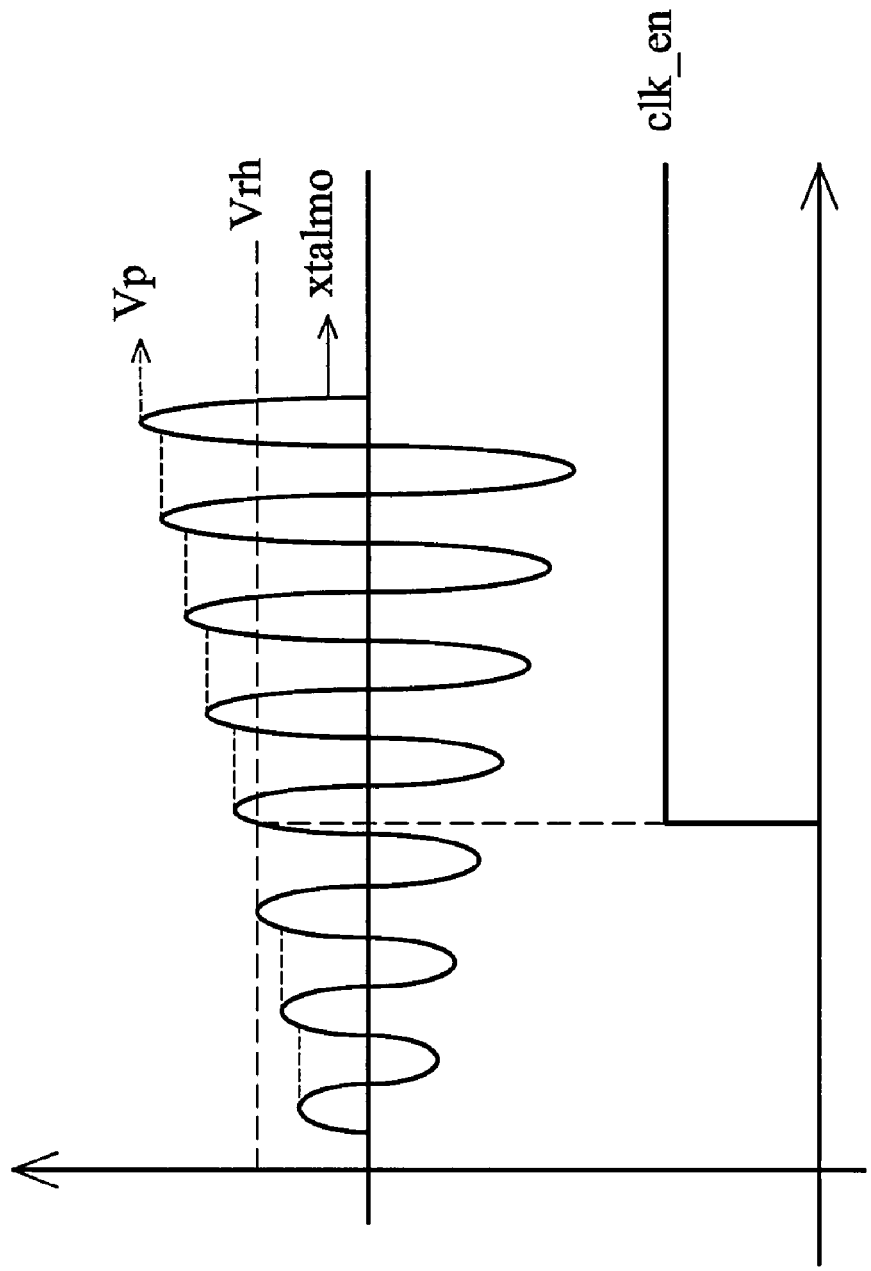
FIG. 6B shows a waveform of signals generated in the signal level detector of FIG. 6A.
Figure 7A:
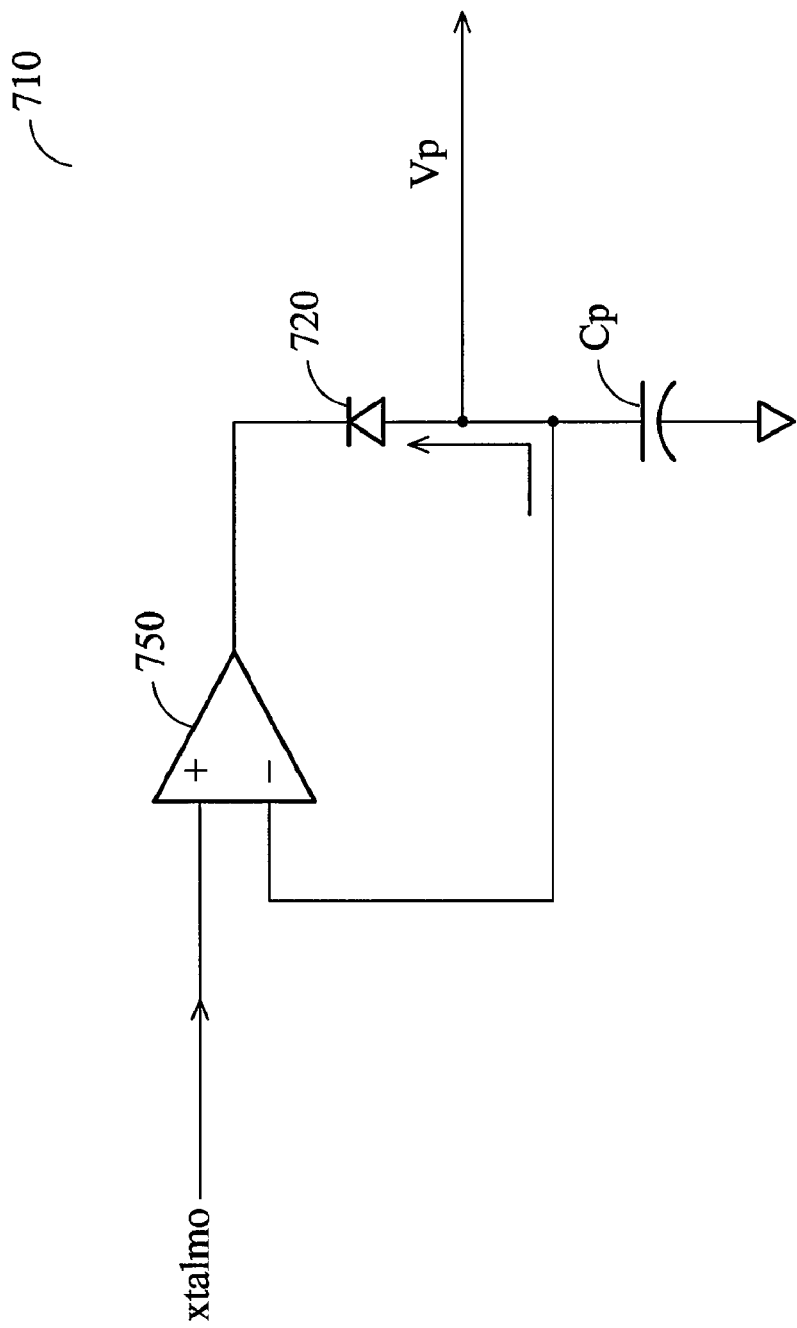
FIG. 7A shows an exemplary embodiment of a bottom hold circuit.
Figure 7B:
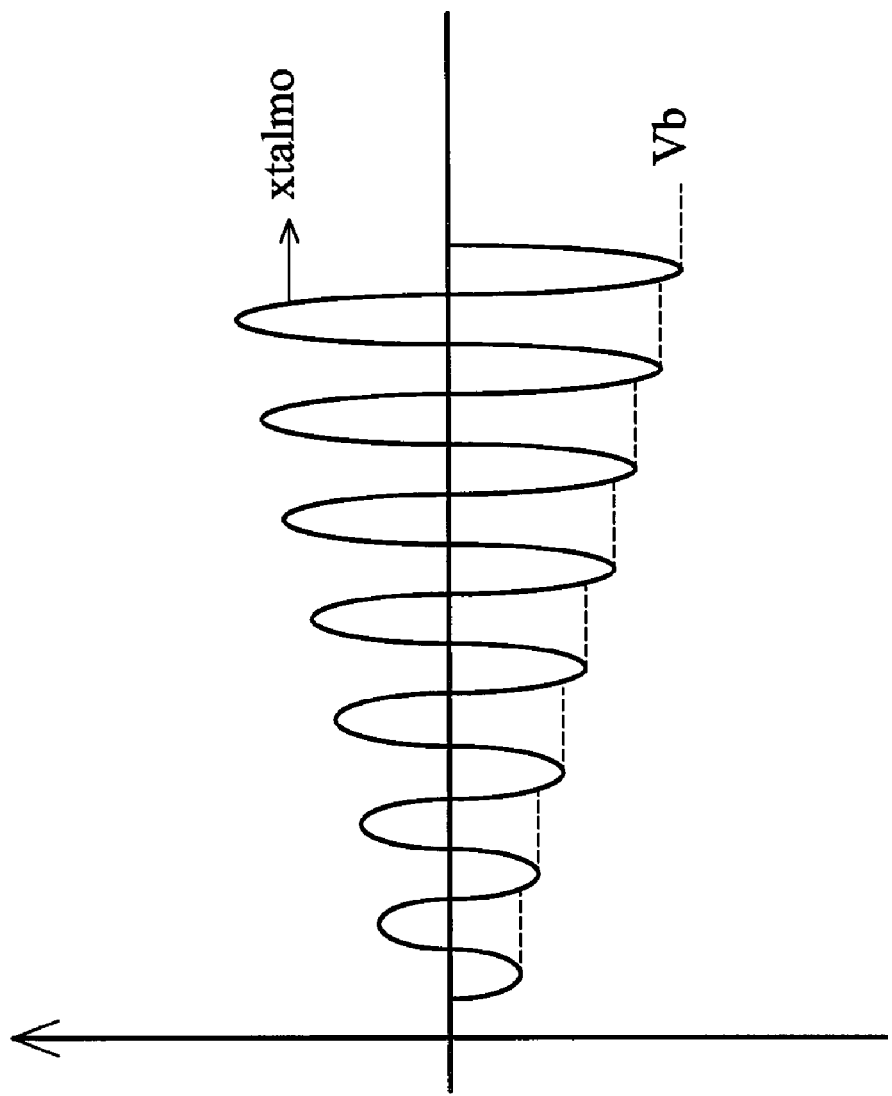
FIG. 7B shows a waveform of the oscillating signal xtalmo and the bottom hold signal Vb in FIG. 7A.

FIG. 5 shows an exemplary embodiment of the signal level detector 420, comprising a single level detector 510 and a single level decision circuit 520. The single level detector 520 receives the oscillating signal xtalmo and detects the signal level thereof to generate a level signal Vl accordingly. The single level decision circuit 520, coupled to the single level detector 510, compares the level signal Vl with the reference level Vr to generate the enable signal clk_en. FIG. 6A shows an exemplary embodiment of the single level detector 510 and a single level decision circuit 520, wherein the single level detector 510 is a peak hold circuit 610 and the single level decision circuit 520 is a comparator 630. The peak hold circuit 610 holds the peak of the oscillating signal xtalmo to generate a peak hold signal Vp. The comparator 630 receives the peak hold signal Vp and a reference high level Vrh, the reference level Vr of FIG. 5, at positive and negative terminals thereof respectively to generate the enable signal clk_en in accordance with a level comparison result of signals Vp and Vrh. The enable signal clk_en is asserted when the peak hold signal Vp exceeds the reference high level Vrh. FIG. 6B shows waveforms of signals xtalmo, Vp, Vrh and clk_en. As shown, the peak hold signal Vp represents the peak of the oscillating signal xtalmo and the enable signal clk_en remains in a LOW state when the level of the peak hold signal Vp is lower than the reference high level Vrh and goes to a HIGH state when the peak hold signal Vp exceeds the reference high level Vrh. As shown, the peak hold circuit 610 comprises a diode 620, a capacitor Cp, and an operational amplifier (OP) 650. The OP 650 receives the oscillating signal xtalmo at a positive input terminal thereof. The diode 620 has an anode coupled to an output terminal of the OP 650 and a cathode coupled back to a negative input terminal of the OP 650, generating the peak hold signal Vp. The capacitor Cp is coupled to the cathode of the diode 620 at one end and to ground at the other. When the level of the oscillating signal xtalmo exceeds that of the peak hold signal Vp, the diode 620 is forward-biased and a current generated at the output terminal of the OP 650 charges the capacitor Cp until the level of the oscillating signal xtalmo equals that of the peak hold signal Vp. Alternatively, the signal level detector 410 can also compare the bottom of the oscillating signal xtalmo with a reference low level Vrl to generate the enable signal clk_en. In this case, the single level detector 510 is a bottom hold circuit and the single level decision circuit 520 compares the level signal Vl representing the bottom peak of the oscillating signal xtalmo with the reference low level Vrl. When the level of the level signal Vl, i.e. the bottom of the oscillating signal xtalmo, exceeds the reference low level Vrl, the enable signal clk_en is asserted. FIG. 7A shows an exemplary embodiment of the single level detector 510 which is a bottom hold circuit 710. The bottom hold circuit 710 is similar to the peak hold circuit 610 except that a cathode of a diode 720 thereof is coupled to an output terminal of the OP 750 and an anode thereof is coupled back to a negative input terminal of the OP 750. Thus, when the level of a bottom hold signal Vb generated at the anode of the diode 720 exceeds that of the oscillating signal xtalmo, the capacitor Cp is discharged until the level of the bottom hold signal Vb equals that of the oscillating signal xtalmo. FIG. 7B shows waveforms of signals xtalmo, and Vb. As shown, the bottom hold signal Vb represents the bottom peak of the oscillating signal xtalmo. The peak hold circuit 610 and the bottom hold circuit 710 are merely examples and it should be appreciated by those skilled in the art that adjustment of electronic components of the peak hold circuit and the bottom hold circuit in accordance with desired functions is applicable within the disclosure.

Figure 8:
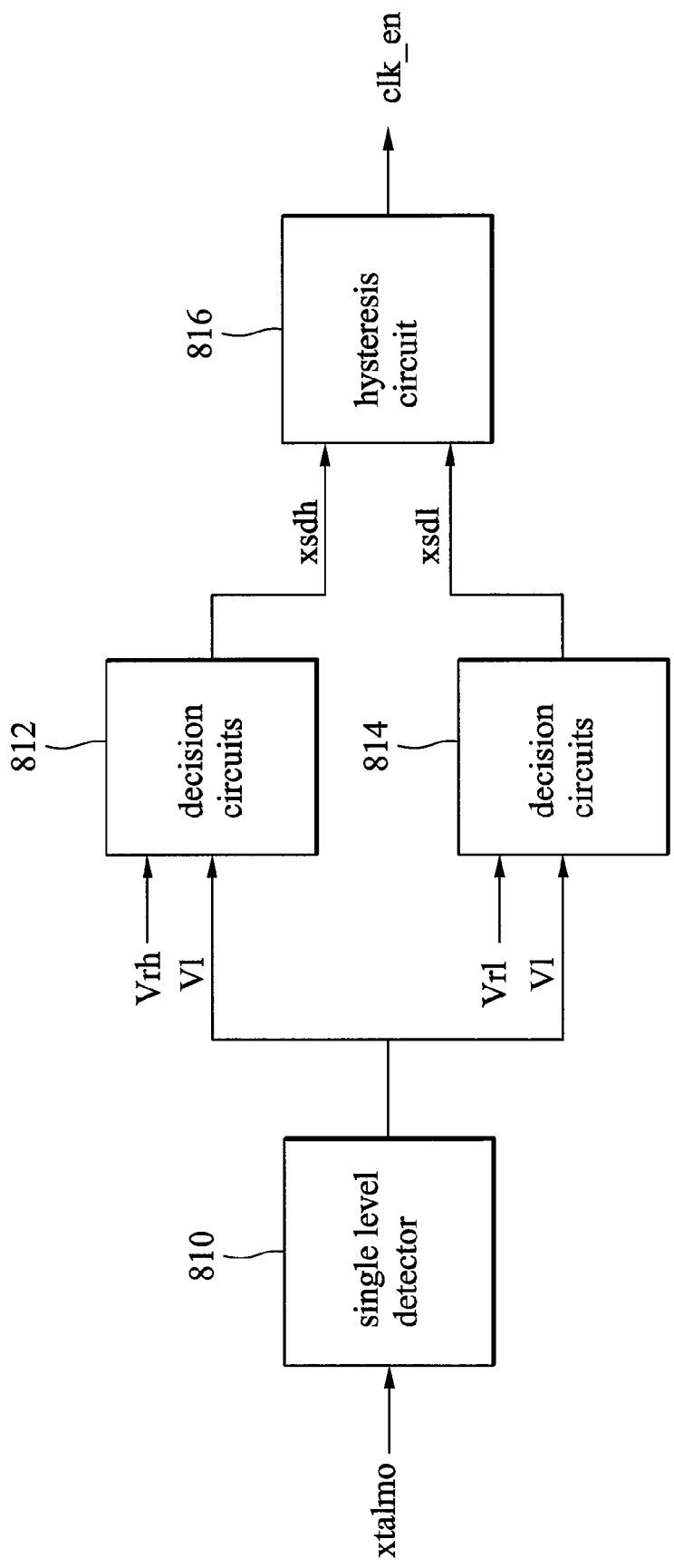
FIG. 8 shows another exemplary embodiment of a signal level detector.
Figure 9:
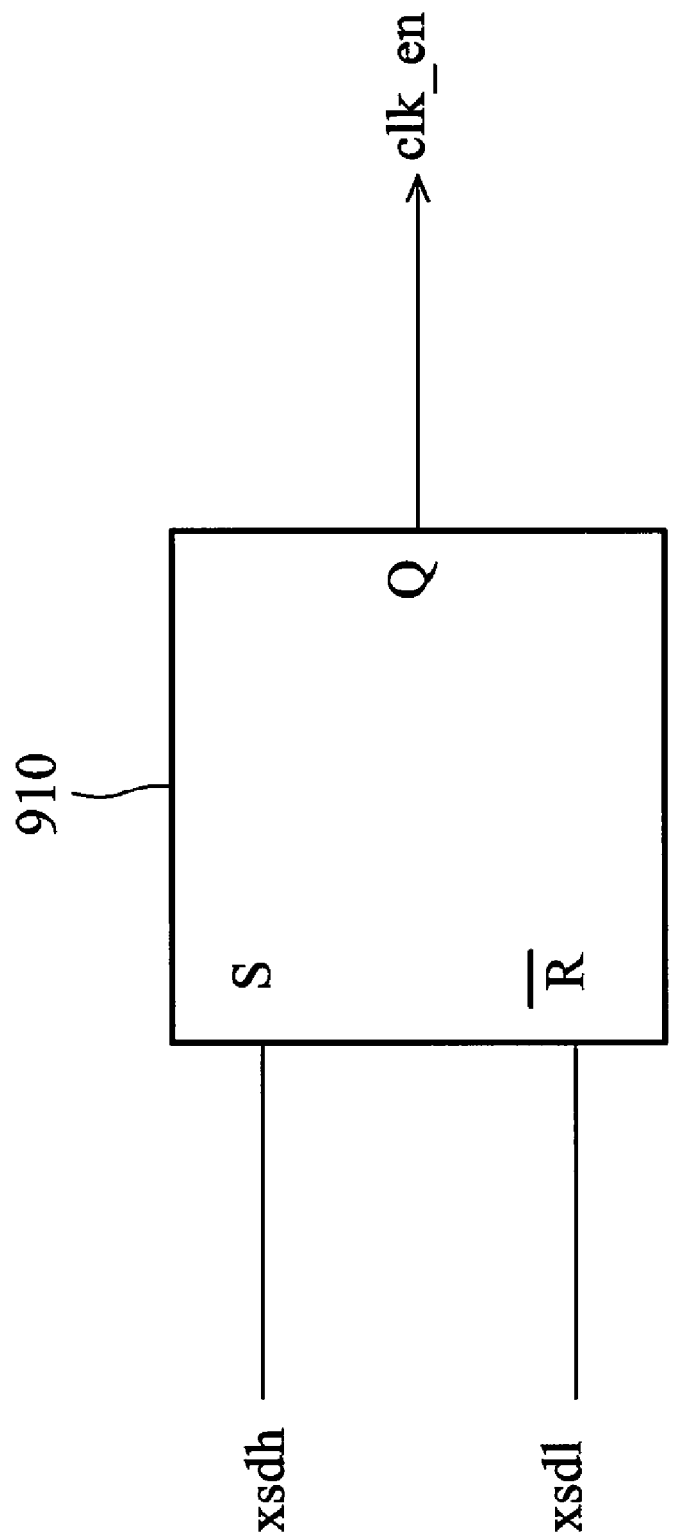
FIG. 9 shows an exemplary embodiment of a hysteresis circuit.
Figure 10:
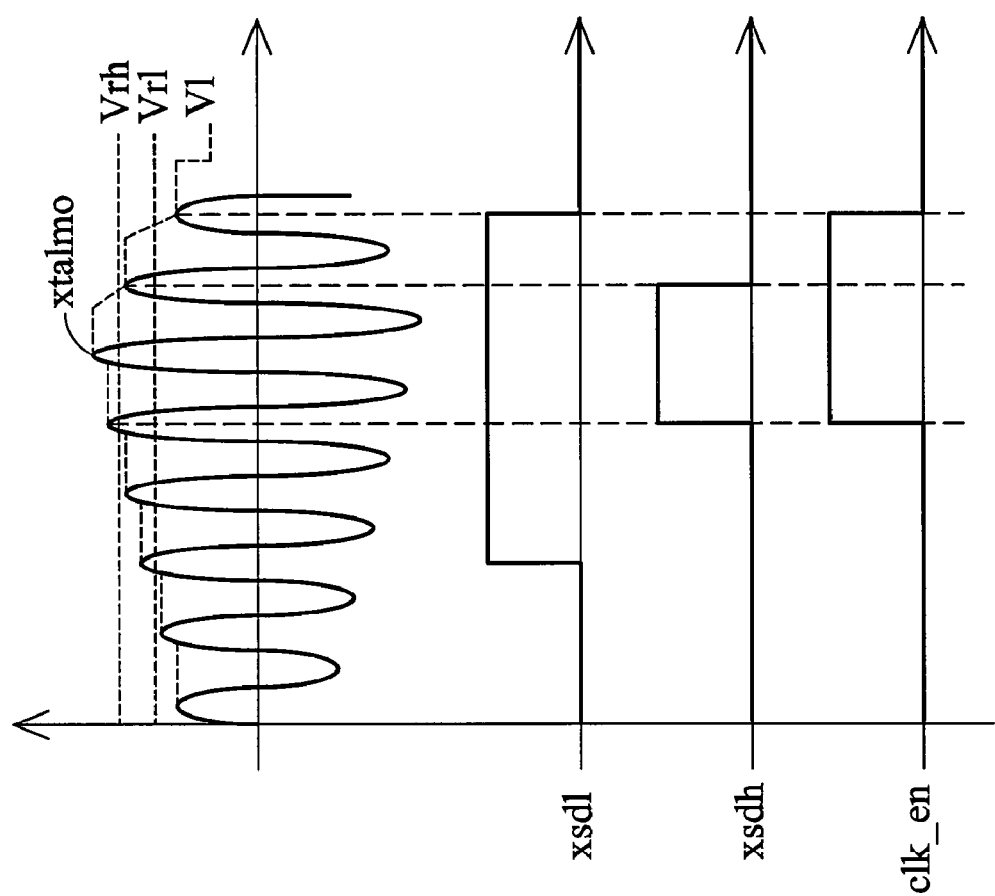
FIG. 10 shows a waveform of the signals generated in the signal level detector of FIG. 8.

FIG. 8 shows another exemplary embodiment of the signal level detector 420 comprising a single level detector 810, two decision circuits 812 and 814, and a hysteresis circuit 816. The single level detector 810 is similar to the single level detector 510 that it detects the signal level of the oscillating signal xtalmo to generate the level signal Vl accordingly. Likewise, the single level detector 810 can be the peak hold circuit 610 or the bottom hold circuit 710 to hold the peak and bottom of the received oscillating signal xtalmo and generates a peak hold signal Vp and a bottom hold signal Vb respectively. The decision circuits 812 and 814 are also similar to the comparator 630, wherein the decision circuit 812 and 814 are coupled to the single level detector 810 and compare the level signal Vl with a reference high level Vrh and a reference low level Vrl respectively, thereby generating level comparative signals xsdh and xsdl respectively. Unlike the signal level detector of FIG. 4 utilizing a single reference level, the signal level detector of FIG. 8 utilizes two reference levels, avoiding erroneous judgement when the noise of the oscillating signal xtalmo exceeds the single reference level. After obtaining two level comparative signals xsdh and xsdl from the decision circuits 812 and 814, a hysteresis circuit 816 receives the level comparative signals xsdh and xsdl, and performs a hysteresis operation in accordance with the level comparative signals xsdh and xsdl to generate the enable signal elk_en. The hysteresis circuit 816 has a hysteresis characteristic with respect to the input and output signal levels, i.e., the output signal level trips from one state to the other at different levels of the input signal in response to the direction of the change in the input signal. FIG. 9 shows an exemplary embodiment of the hysteresis circuit 816. As shown, the hysteresis circuit 816 is a SR flip-flop 910 receiving level comparative signals xsdh and xsdl at a SET and a RESET' terminals thereof and outputs the enable signal clk_en at a Q ouput terminal. The operation of the SR flip-flop 910 is shown in Table 1. The enable signal clk_en goes to LOW state when both the comparative signals xsdh and xsdl are in a LOW state and goes to HIGH when both the comparative signals xsdh and xsdl are in a HIGH state. When in the presence of noise, for example, the order of states of the comparative signals xsdh and xsdl is 00→01→11→01→11 whereas the enable signal clk_en generated will be 0→0→1→1→1. It can be observed that with the hysteresis characteristic of the hysteresis circuit 816, the enable signal clk_en does not switch states often even in the presence of noise, thus problems caused by noise are avoided. Moreover, the hysteresis range of the hysteresis circuit 816 can be adjusted by adjusting the reference high level Vrh and reference low level Vrl, increasing design flexibility. Assuming the single level detector 810 is a peak hold circuit such as the peak hold circuit 610 wherein the level signal Vl generated by the single level detector 810 is the peak hold signal Vp of the oscillating signal xtalmo. FIG. 10 shows the waveforms of signals xtalmo, Vl, Vrh, Vrl, xsdh, xsdl, and clk_en when utilizing a peak hold circuit in the single level detector 810.

TABLE 1

| S(xsdh) | R'(xsdl) | Q(clk_en) |
|---------|----------|-----------|
| 0 | 0 | 0 |
| 0 | 1 | Q'(hold Q) |
| 1 | 0 | Doesn't exist |
| 1 | 1 | 1 |

Further, differential techniques can also be applied to the detection of the signal level of the oscillating signal xtalmo.

Figure 11:
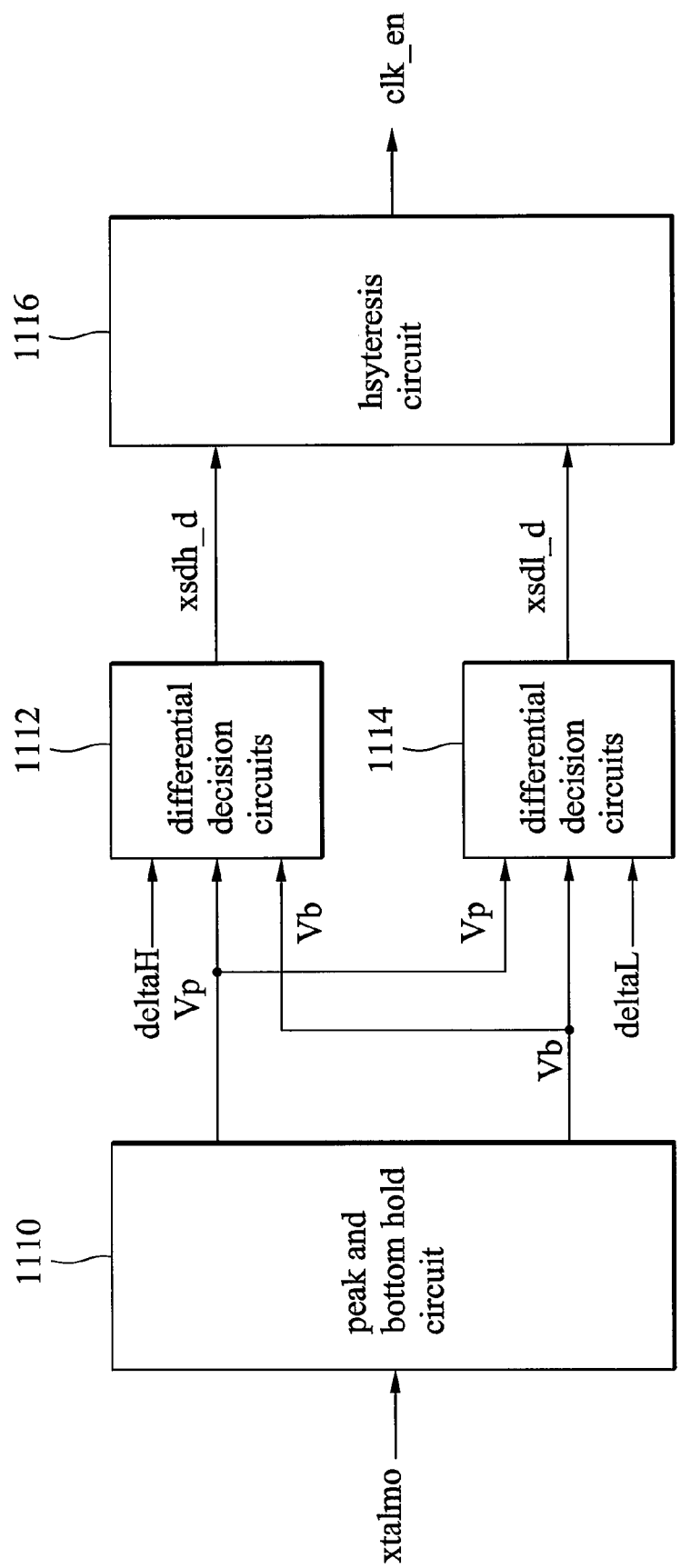
FIG. 11 shows another exemplary embodiment of a signal level detector.

FIG. 11 shows another exemplary embodiment of the signal level detector 420 comprising a peak and bottom hold circuit 1110, two differential decision circuits 1112 and 1114, and a hysteresis circuit 1116. The peak and bottom hold circuit 1110 herein functions as the combination of the peak hold circuit 610 and the bottom hold circuit 710 to hold the peak and bottom of the received oscillating signal xtalmo respectively and generates a peak hold signal Vp and a bottom hold signal Vb accordingly. The differential decision circuits 1112 and 1114 are also similar to the decision circuits 812 and 814, comparing the peak hold signal Vp and the bottom hold signal Vb with two reference levels and generating differential level comparative signals xsdh_d and xsdl_d respectively except that the differential decision circuit 1112 compares the difference between the peak hold signal Vp and the bottom hold signal Vb to the difference deltaH between a first reference high level Vrh and a second reference high level Vrh' and the differential decision circuit 1114 compares the difference between the peak hold signal Vp and the bottom hold signal Vb to the difference deltaL between a first reference low level Vrl and a second reference low level Vrl'. For example, the differential level comparative signal xsdh_d is in HIGH state when (Vp-Vb)-(deltaH)>0 wherein deltaH=Vrh-Vrh'. Thus, level detection is employed with a range instead of a single line, improving detection decision and design flexibility. The hysteresis circuit 1116 is similar to the hysteresis circuit 816, in that it is coupled to the differential decision circuits 1112 and 1114 and performs a hysteresis operation in accordance with the differential level comparative signals xsdh_d and xsdl_d to generate the enable signal clk_en.

Figure 12:
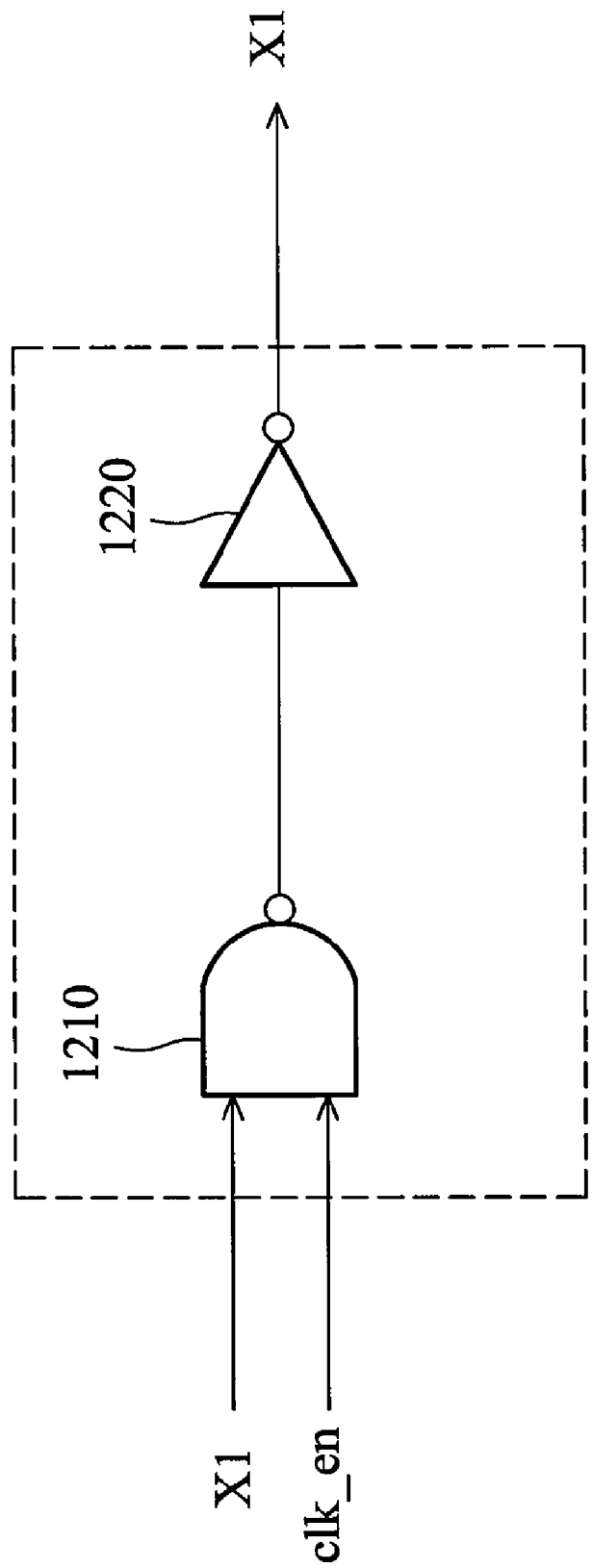
FIG. 12 shows an exemplary embodiment of a gating logic.

After obtaining the enable signal clk_en from described signal level detector 410, the gating logic 420 determines whether to output the output clock signal X1 according to the received enable signal clk_en. FIG. 12 shows an exemplary embodiment of the gating logic 420 comprising a NAND gate 1210 and a inverter 1220. The NAND gate receives the output clock signal X1 and the enable signal clk_en. The inverter 1220 is coupled to the output of the NAND gate 1210 and converts an output signal therefrom to output the output clock signal X1. The gating logic 420 herein outputs the clock signal X1 when the enable signal clk_en is asserted.

Figure 13:
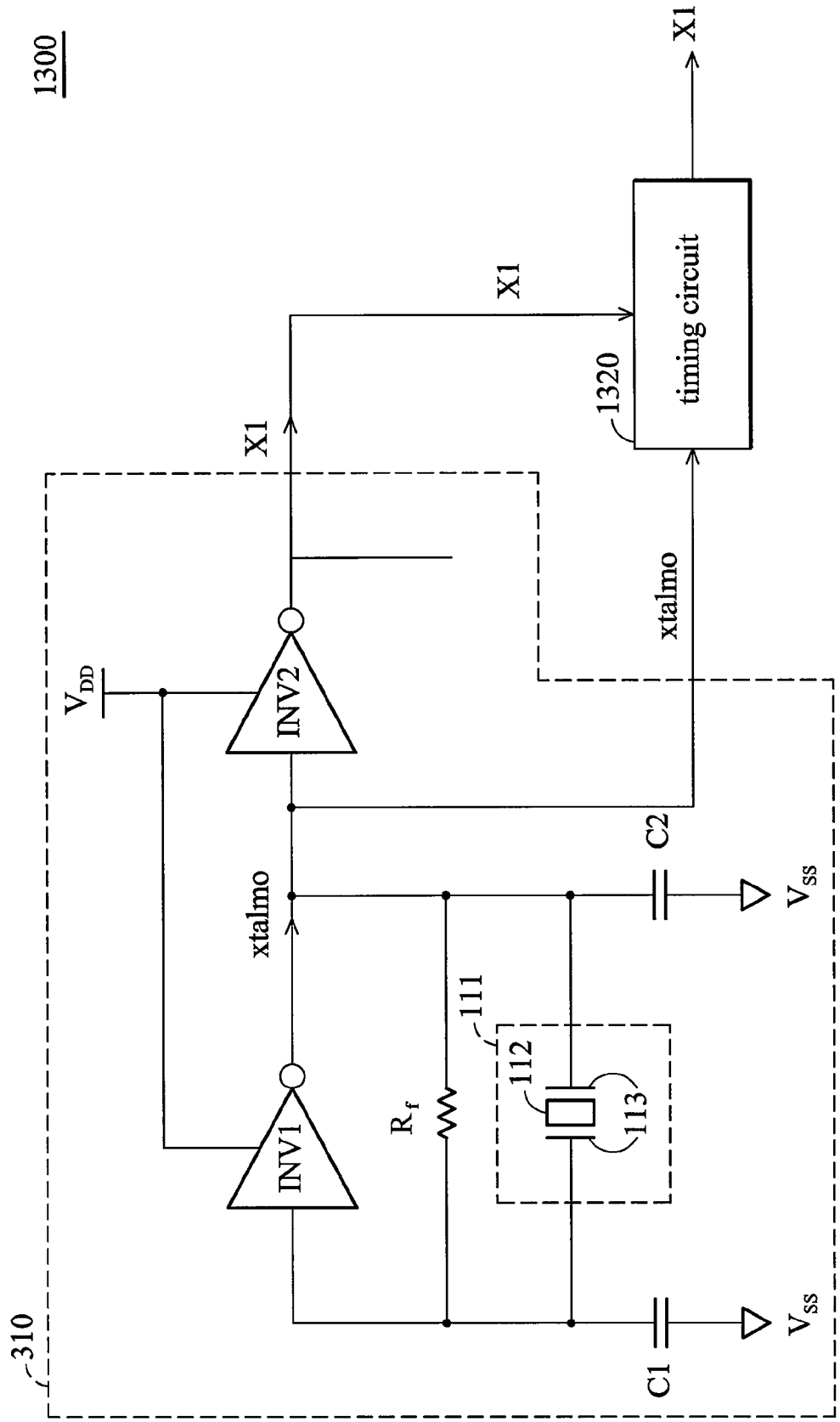
FIG. 13 is a schematic diagram of a noise removal circuit according to another embodiment of the invention.
Figure 14:
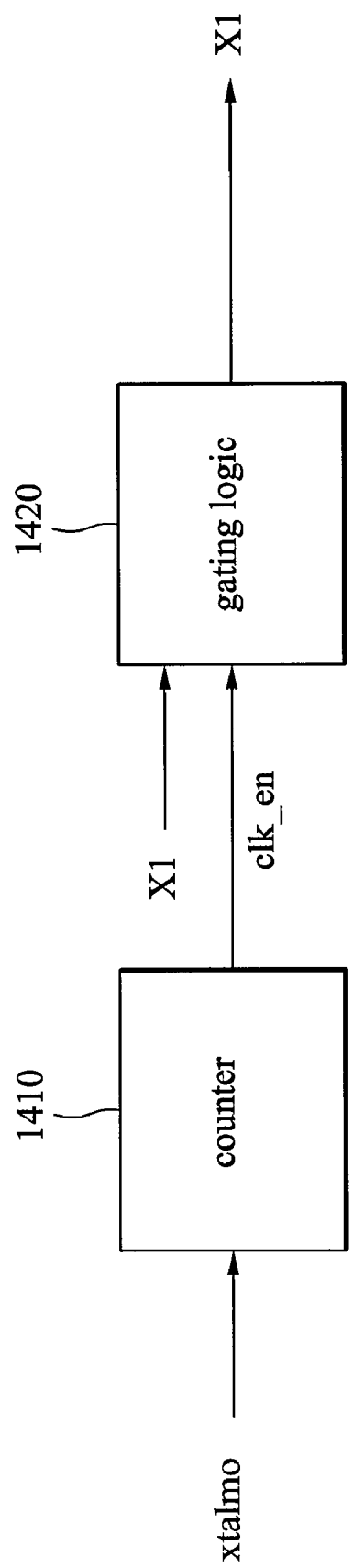
FIG. 14 shows an exemplary embodiment of a timing circuit.

While the noise removal circuit detects the signal level of the oscillating signal xtalmo to determine whether to output the output clock signal X1, the same object can also be achieved with timing detection. FIG. 13 is a schematic diagram of a noise removal circuit 1300 according to another embodiment of the invention, comprising a crystal oscillator 310 and a timing circuit 1320. FIG. 13 uses the same labels as FIG. 1 which perform the same function, and thus are not described in further detail. The crystal oscillator 310, similar to the crystal oscillator 110 generates an oscillating signal xtalmo and an output clock signal X1. The timing circuit 1320, coupled to the crystal oscillator 310, receives the oscillating signal xtalmo and outputs the output clock signal X1 after a predetermined interval T.

FIG. 1410 shows an exemplary embodiment of the timing circuit 1320. As shown, the timing circuit 1320 comprises a counter 1410 and a gating logic 1420. The counter 420 receives the oscillating signal xtalmo from the crystal oscillator 310, triggering a counting operation thereof and generates an enable signal clk_en after the predetermined interval T. For example, with a 12 bit counter and a 25 MHz crystal oscillator 310, the interval T is about 160 ms. The enable clk_en is asserted by the counter 1410 after 160 ms. The gating logic 1420 then outputs the output clock signal X1 in response to the enable signal clk_en from the counter 1410. It is noted that the gating logic 1420 can also utilize the gating logic shown in FIG. 12.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A noise removal circuit comprising:
    a crystal oscillator generating an oscillating signal and an output clock signal; and
    a level decision module coupled to the crystal oscillator, detecting the signal level of the oscillating signal and outputting the output clock signal when the signal level of the oscillating signal exceeds a first reference level.

2. The noise removal circuit as claimed in claim 1, wherein the crystal oscillator comprises a first inverter amplifying the oscillating signal to generate the output clock signal.

3. The noise removal circuit as claimed in claim 1, wherein the level decision module comprises a signal level detector detecting the signal level of the oscillating signal and generating an enable signal accordingly.

4. The noise removal circuit as claimed in claim 3, wherein the level decision module further comprises a gating logic coupled to the signal level detector, outputting the output clock signal in response to the enable signal.

5. The noise removal circuit as claimed in claim 4, wherein the gating logic comprises a NAND gate receiving the output clock signal and the enable signal, and a second inverter coupled to the output of the NAND gate, outputting the output clock signal.

6. The noise removal circuit as claimed in claim 3, wherein the signal level detector comprises a single level detector receiving the oscillating signal and generating a level signal in accordance with the signal level of the oscillating signal.

7. The noise removal circuit as claimed in claim 6, wherein the signal level detector further comprises a single level decision circuit coupled to the single level detector, comparing the level signal with the first reference level to generate the enable signal.

8. The noise removal circuit as claimed in claim 6, wherein the signal level detector further comprises:
    a first decision circuit coupled to the single level detector, comparing the level signal with the first reference level to generate a first level comparative signal;
    a second decision circuit coupled to the single level detector, comparing the level signal with a second reference level to generate a second level comparative signal; and
    a first hysteresis circuit coupled to the first and second decision circuits, performing a hysteresis operation in accordance with the first and second level comparative signals to generate the enable signal.

9. The noise removal circuit as claimed in claim 8, wherein the first hysteresis circuit is a SR flip-flop.

10. The noise removal circuit as claimed in claim 6, wherein the single level detector is a peak hold circuit.

11. The noise removal circuit as claimed in claim 10, wherein the peak hold circuit comprises:
    a first operational amplifier receiving the oscillating signal at a positive input terminal thereof;
    a first diode comprising an anode coupled to an output terminal of the first operational amplifier and a cathode coupled to a negative input terminal of the first operational amplifier, generating the level signal thereat; and a first capacitor comprising a first terminal coupled to the cathode of the first diode and a second terminal coupled to ground.

12. The noise removal circuit as claimed in claim 6, wherein the single level detector is a bottom hold circuit.

13. The noise removal circuit as claimed in claim 12, wherein the bottom hold circuit comprises:

a second operational amplifier receiving the oscillating signal at a positive input terminal thereof;

a second diode comprising a cathode coupled to an output terminal of the second operational amplifier and a anode coupled to a negative input terminal of the second operational amplifier, generating the level signal thereat; and a second capacitor comprising a third terminal coupled to the anode of the second diode and a fourth terminal coupled to ground.

14. The noise removal circuit as claimed in claim 3, wherein the signal level detector comprises:

a peak and bottom hold circuit receiving the oscillating signal and generating a peak hold signal and a bottom hold signal in accordance with peak and bottom levels of the oscillating signal respectively;

a first differential decision circuit coupled to the peak and bottom hold circuit, comparing the difference between the peak hold signal and the bottom hold signal with the difference between the first reference level and a third reference level to generate a first differential level comparative signal;

a second differential decision circuit coupled to the peak and bottom hold circuit, comparing the difference between the peak hold signal and the bottom hold signal with the difference between a second and a fourth reference levels to generate a second differential level comparative signal; and a hysteresis circuit coupled to the first and second differential decision circuit, performing a hysteresis operation in accordance with the first and second differential level comparative signals to generate the enable signal.

15. The noise removal circuit as claimed in claim 14, wherein the hysteresis circuit is a SR flip-flop.

16. A noise removal circuit comprising:

a crystal oscillator generating an oscillating signal and an output clock signal;

a signal level detector coupled to the crystal oscillator, detecting the signal level of the oscillating signal, comparing the detection result with a first reference level and generating an enable signal accordingly; and a gating logic coupled to the signal level detector, outputting the output clock signal in response to the enable signal.

17. The noise removal circuit as claimed in claim 16, wherein the crystal oscillator comprises a first inverter amplifying the oscillating signal to generate the output clock signal.

18. The noise removal circuit as claimed in claim 16, wherein the gating logic comprises a NAND gate receiving the output clock signal and the enable signal, and a second inverter coupled to the output of the NAND gate, outputting the output clock signal.

19. The noise removal circuit as claimed in claim 16, the signal level detector comprising a single level detector receiving the oscillating signal and generating a level signal in accordance with the signal level of the oscillating signal.

20. The noise removal circuit as claimed in claim 19, wherein the signal level detector further comprises a single level decision circuit coupled to the single level detector, comparing the level signal with the first reference level to generate the enable signal.

21. The noise removal circuit as claimed in claim 19, wherein the signal level detector further comprises:

a first decision circuit coupled to the single level detector, comparing the level signal with the first reference level to generate a first level comparative signal;

a second decision circuit coupled to the single level detector, comparing the level signal with a second reference level to generate a second level comparative signal; and a first hysteresis circuit coupled to the first and second decision circuits, performing a hysteresis operation in accordance with the first and second level comparative signals to generate the enable signal.

22. The noise removal circuit as claimed in claim 21, wherein the first hysteresis circuit is a SR flip-flop.

23. The noise removal circuit as claimed in claim 19, wherein the single level detector is a peak hold circuit.

24. The noise removal circuit as claimed in claim 23, wherein the peak hold circuit comprises:

a first operational amplifier receiving the oscillating signal at a positive input terminal thereof;

a first diode comprising an anode coupled to an output terminal of the first operational amplifier and a cathode coupled to a negative input terminal of the first operational amplifier, generating the level signal thereat; and a first capacitor comprising a first terminal coupled to the cathode of the first diode and a second terminal coupled to ground.

25. The noise removal circuit as claimed in claim 19, wherein the single level detector is a bottom hold circuit.

26. The noise removal circuit as claimed in claim 25, wherein the bottom hold circuit comprises:

a second operational amplifier receiving the oscillating signal at a positive input terminal thereof;

a second diode comprising a cathode coupled to an output terminal of the second operational amplifier and an anode coupled to a negative input terminal of the second operational amplifier, generating the level signal thereat; and a second capacitor comprising a third terminal coupled to the anode of the second diode and a fourth terminal coupled to ground.

27. The noise removal circuit as claimed in claim 16, wherein the signal level detector comprises:

a peak and bottom hold circuit receiving the oscillating signal and generating a peak hold signal and a bottom hold signal in accordance with peak and bottom levels of the oscillating signal respectively;

a first differential decision circuit coupled to the peak and bottom hold circuit, comparing the difference between the peak hold signal and the bottom hold signal with the difference between the first reference level and a third reference level to generate a first differential level comparative signal;

a second differential decision circuit coupled to the peak and bottom hold circuit, comparing the difference between the peak hold signal and the bottom hold signal with the difference between a second and a fourth reference levels to generate a second differential level comparative signal; and a hysteresis circuit coupled to the first and second differential decision circuit, performing a hysteresis operation in accordance with the first and second differential level comparative signals to generate the enable signal.

28. The noise removal circuit as claimed in claim 27, wherein the hysteresis circuit is a SR flip-flop.

29. A noise removal circuit comprising:
 a crystal oscillator generating an oscillating signal and an output clock signal; and
 a timing circuit coupled to the crystal oscillator, receiving the oscillating signal and outputting the output clock signal after a predetermined interval, wherein the timing circuit further comprises a gating logic coupled to a counter, outputting the output clock signal in response to an enable signal, and wherein the gating logic comprises a NAND gate receiving the output clock signal and the enable signal, and a second inverter coupled to the output of the NAND gate, outputting the output clock signal.

30. The noise removal circuit as claimed in claim 29, wherein the crystal oscillator comprises a first inverter amplifying the oscillating signal to generate the output clock signal.

31. The noise removal circuit as claimed in claim 29, wherein the timing circuit comprises the counter receiving the oscillating signal for triggering a counting operation thereof and generating an enable signal after the predetermined interval.

* * * * *